US012564091B2

(12) United States Patent
Tsai et al.

(10) Patent No.: US 12,564,091 B2
(45) Date of Patent: Feb. 24, 2026

(54) SILICON FRAGMENT DEFECT REDUCTION IN GRINDING PROCESS

(71) Applicant: Taiwan Semiconductor Manufacturing Company, Hsinchu (TW)

(72) Inventors: Chia-Cheng Tsai, Hsinchu (TW); Kuo-Hsin Ku, Taipei (TW); Chien-Wei Chang, Taoyuan (TW); Chun Yan Chen, Zhubei (TW); Chia-Chi Chung, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 401 days.

(21) Appl. No.: 17/667,619

(22) Filed: Feb. 9, 2022

(65) Prior Publication Data

US 2023/0042074 A1 Feb. 9, 2023

Related U.S. Application Data

(60) Provisional application No. 63/230,271, filed on Aug. 6, 2021.

(51) Int. Cl.
*H01L 23/31* (2006.01)
*H01L 21/02* (2006.01)
(Continued)

(52) U.S. Cl.
CPC .... *H01L 23/3192* (2013.01); *H01L 21/02118* (2013.01); *H01L 21/022* (2013.01);
(Continued)

(58) Field of Classification Search
CPC ............. H01L 21/02013; H01L 21/304; H01L 21/463
See application file for complete search history.

(56) References Cited

U.S. PATENT DOCUMENTS

| | | | | |
|---|---|---|---|---|
| 5,929,509 A | * | 7/1999 | Shen ....................... | H01L 21/02 257/E21.214 |
| 6,239,035 B1 | * | 5/2001 | Harris ............... | H01L 21/76801 438/761 |

(Continued)

FOREIGN PATENT DOCUMENTS

TW    200402802 A    2/2004

OTHER PUBLICATIONS

Taiwan Office Action of Application No. 1142117780, Dated Nov. 7, 2025.

*Primary Examiner* — Brian Turner
(74) *Attorney, Agent, or Firm* — Lippes Mathias LLP

(57) ABSTRACT

A method is provided for fabricating a semiconductor wafer having a device side, a back side opposite the device side and an outer periphery edge. Suitably, the method includes: forming a top conducting layer on the device side of the semiconductor wafer; forming a passivation layer over the top conducting layer, the passivation layer being formed so as not to extend to the outer periphery edge of the semiconductor wafer; and forming a protective layer over the passivation layer, the protective layer being spin coated over the passivation layer so as to have a smooth top surface at least in a region proximate to the outer periphery edge of the semiconductor wafer.

20 Claims, 8 Drawing Sheets

(51) Int. Cl.

| | | |
|---|---|---|
| *H01L 21/027* | (2006.01) |
| *H01L 21/304* | (2006.01) |
| *H01L 21/683* | (2006.01) |
| *H01L 23/29* | (2006.01) |
| *H01L 23/544* | (2006.01) |

(52) U.S. Cl.
CPC ........ *H01L 21/0274* (2013.01); *H01L 21/304* (2013.01); *H01L 21/6836* (2013.01); *H01L 23/293* (2013.01); *H01L 23/3171* (2013.01); *H01L 23/544* (2013.01); *H01L 2221/68327* (2013.01); *H01L 2221/6834* (2013.01); *H01L 2223/5446* (2013.01)

(56) References Cited

U.S. PATENT DOCUMENTS

| | | | | |
|---|---|---|---|---|
| 2003/0045121 A1* | 3/2003 | Higashi | ............. | H01L 21/76801 438/758 |
| 2005/0170641 A1* | 8/2005 | Kondo | ................ | H01L 21/7684 257/E21.583 |
| 2007/0004193 A1* | 1/2007 | Wu | ................... | H01L 21/76808 438/763 |
| 2013/0154060 A1* | 6/2013 | Yeh | ................... | H01L 21/76883 438/597 |
| 2017/0154811 A1* | 6/2017 | Wu | .......................... | H01L 24/14 |
| 2018/0061951 A1* | 3/2018 | Kitamura | ............ | H01L 29/6606 |
| 2019/0393216 A1* | 12/2019 | Wu | ..................... | H01L 27/0688 |
| 2020/0328364 A1* | 10/2020 | Fichet | ................. | H10K 10/464 |
| 2021/0057225 A1* | 2/2021 | Sandoh | .............. | H01L 21/3065 |

* cited by examiner

FEOL PROCESSING — 100

BEOL PROCESSING — 200
FORM TME LAYER

FORM PASSIVATION LAYER — 300
WEE TO REMOVE PASSIVATION LAYER AT WAFER EDGE — 330

FORM POLYIMIDE LAYER — 400

APPLY BACK SIDE GRINDING — 500

1000

300

310 DEPOSIT PASSIVATION LAYER

320 DEPOSIT PHOTORESIST

330 EXPOSE PHOTORESIST USING WAFER EDGE EXPOSURE (WEE)

340 DEVELOP PHOTORESIST

350 ETCH PASSIVATION LAYER

360 REMOVE REMAINING PHOTORESIST

SILICON FRAGMENT DEFECT REDUCTION IN GRINDING PROCESS

PRIORITY CLAIM AND CROSS-REFERENCE

This application claims the benefit of U.S. Provisional Application No. 63/230,271 filed Aug. 6, 2021, which is incorporated herein by reference in its entirety.

BACKGROUND

The following relates to the semiconductor arts, and in particular, to a semiconductor device and method and/or apparatus for manufacturing the same.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1:
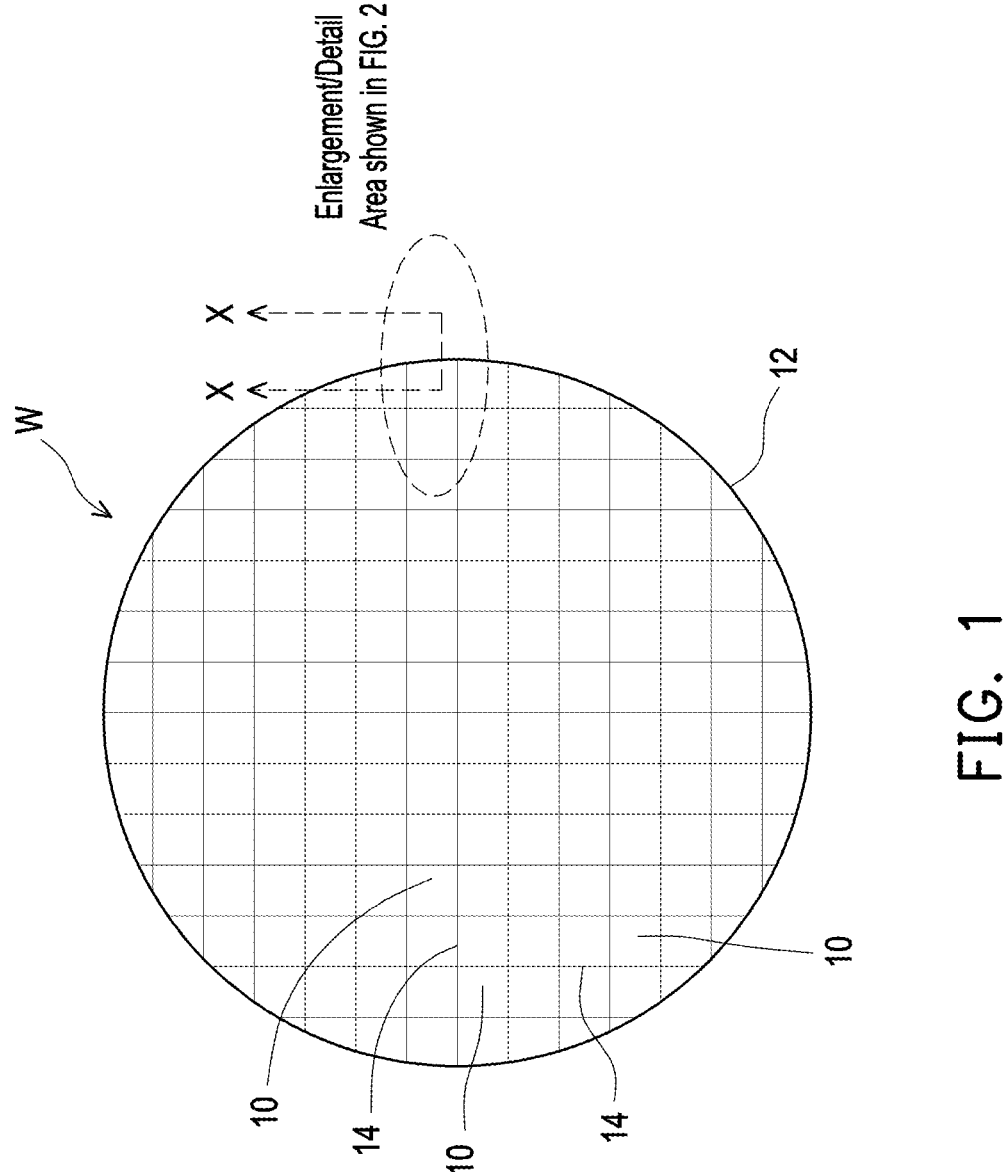
FIG. 1 diagrammatically illustrates a top plan view of a semiconductor wafer in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, in accordance with some embodiments disclosed herein, a semiconductor wafer may have a plurality of individual semiconductor devices formed thereon. For example, semiconductor devices such as Metal-Oxide-Semiconductor Field-Effect Transistor (MOS-FET) devices, Integrated Circuits (ICs), etc. are manufactured and/or fabricated on a semiconductor wafer in a semiconductor fabrication plant, commonly referred to as a FAB or foundry. There are commonly many processing steps applied to the semiconductor wafer to produce a desired semiconductor device and/or numerous semiconductor devices on a wafer. For example, semiconductor fabrication can be a multiple-step sequence of photolithographic, mechanical and/or chemical processing steps (for example, such as surface passivation, thermal oxidation, planar diffusion, junction isolation, etc.) during which electronic circuits and/or semiconductor devices are gradually created on the semiconductor wafer.

In accordance with some embodiments described herein, the semiconductor fabrication process is considered to include a front-end-of-line (FEOL) portion, an optional middle-end-of-line (MEOL) portion, and a back-end-of-line (BEOL) portion. The FEOL is the first portion of the semiconductor fabrication process (for example, including IC fabrication processes), whereby individual active devices are patterned on a semiconductor wafer, for example. In some embodiments, the FEOL processes include, without limitation, selecting the type of semiconductor wafer to be used, chemical-mechanical planarization and cleaning of the wafer, shallow trench isolation (STI), well formation, gate module formation, and source and drain creation, among others. In some embodiments, the FEOL process does not include the deposition of metal interconnect layers. In some embodiments, the optional MEOL processes occur after the FEOL processes and include, for example, without limitation, gate contact formation and under bump metallization (UBM) processes, among others. Suitably, in accordance with some embodiments, the BEOL is the final portion of the semiconductor fabrication process (occurring after the FEOL and/or MEOL portions). In some embodiments, the BEOL portion is where, without limitation, individual devices (for example, transistors, capacitors, resistors, etc.) are interconnected with vias and conductive traces, for example.

In some suitable embodiments, scribe lines (also sometimes referred to as "streets") are defined between individual device or die regions of the semiconductor wafer. For example, the individual device or die regions are where individual ICs are formed on the semiconductor wafer. Ultimately, the semiconductor wafer is sawed, broken or otherwise diced along the scribe lines to separate the wafer into individual dies and/or semiconductor devices. In some suitable embodiments, these scribe lines are naturally defined and/or formed during the FEOL and/or BEOL portions of the fabrication process because material that is deposited and/or built-up in the individual device and/or die regions is not deposited therebetween, thus the scribe lines are naturally formed, defined and/or otherwise established, for example, as trenches or troughs residing between the build-up of material deposited in the device and/or die regions in which individual semiconductor devices and/or ICs are formed.

Generally, the surface or side of the semiconductor wafer having devices formed thereon is referred to as the device side, while the opposing surface or side of the wafer is referred to as the back side.

In some embodiments, the semiconductor wafer will generally start with a first thickness, for example, around 680 µm or some other appropriate thickness, that provides a suitable strength to the wafer in order to guard against the wafer undesirably breaking at an inappropriate time during the fabrication processes and/or handling. In accordance with some embodiments disclosed herein, prior to dicing of the semiconductor wafer into individual dies, but after the formation of the semiconductor devices and/or structures on the device side (i.e., after the BEOL processing), the semiconductor wafer is thinned to a second thickness, for example, of about 300 µm to about 380 µm or another suitable thickness, by applying grinding to the back side of the wafer. This back side grinding generally produces silicon dust particles and/or other small fragments removed from the wafer's back side as it is being thinned. Advantageously, some embodiments disclosed herein help protect the device side of the semiconductor wafer against the flow or migration of potentially defect causing fragments from an outer periphery of the wafer inward toward a center of the wafer during the back side grinding.

In accordance with some suitable embodiments disclosed herein, FIG. 1 shows a semiconductor wafer W having a plurality of die or device regions 10 in which individual semiconductor devices and/or ICs are formed. In some embodiments, as shown, the semiconductor wafer W will have a generally circular shape with an outer periphery or edge 12. The wafer W may not have a perfectly circular shape. For example, although not shown the wafer W may include a wafer flat on a portion of the periphery, which is sometimes aligned with the semiconductor crystal orientation and/or may encode other information such as dopant type. In accordance with some embodiments disclosed herein, scribe lines (i.e. streets) 14 are defined between the individual die or device regions 10. In some embodiments, the scribe lines 14 are naturally formed and/or defined during the FEOL and/or BEOL processing, in which material is deposited and/or built-up in the individual die or device regions 10 to form individual semiconductor devices and/or ICs, while no such material deposition or build-up is made therebetween.

Figure 2:
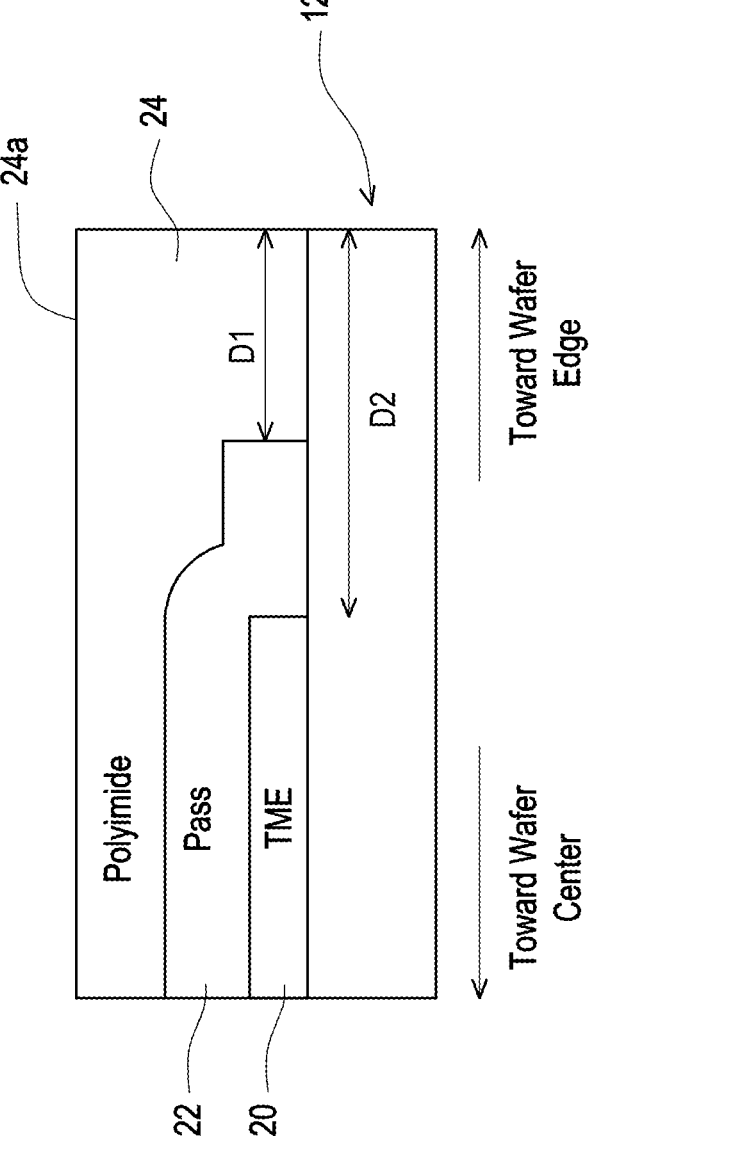
FIG. 2 diagrammatically illustrates a partial lateral cross-section view of the semiconductor wafer shown in FIG. 1, taken along section line X-X, in accordance with some embodiments disclosed herein.

In accordance with some suitable embodiments disclosed herein, FIG. 2 shows a partial lateral cross section of the semiconductor wafer W taken along section line X-X as shown in FIG. 1. This cross-section illustrates the state of the wafer after formation of a passivation layer and protective polyimide layer, as will be described below. The state of the wafer shown in FIG. 2 has thus been prepared for backside wafer thinning, as will also be described below.

In some embodiments, the BEOL processing includes the forming of a top conducting layer or top metal layer, referred to herein at times as the TME layer 20, as shown in FIG. 2.

Suitably, the TME layer 20 is formed by depositing and/or patterning an electrical conductor, such as a metal or metal alloy (for example, aluminum (Al), copper (Cu), silver (Ag) or the like), a metal silicide, etc. on top of the semiconductor product generated up to that point, for example, the resulting product of the FEOL and BEOL processing completed up to that point. In some embodiments, the TME layer 20 may be deposited by physical vapor deposition (PVD), for example, such as sputtering deposition, or any other suitable deposition method. In some suitable embodiments, the TME layer 20 is a formed from AlCu.

In some suitable embodiments, the TME layer 20 does not extend out to the periphery or edge 12 of the semiconductor wafer W. In some suitable embodiments, the TME layer 20 will stop short of the outer periphery or edge 12 of the semiconductor wafer W by a distance D2, which may be, for example, about 1.8 mm or more. For example, the TME layer 20 may be formed only in the areas of the device dies, and these dies typically stop short of the outer periphery or edge 12. Suitably, the TME layer 20 will have a relatively large thickness. For example, the TME layer 20, in accordance with some embodiments, will generally have a thickness greater than or equal to about 20 kÅ (2.0 micron).

In accordance with some suitable embodiments disclosed herein, a passivation layer 22 is deposited, patterned and/or otherwise formed on top of the TME layer 20. Generally deposited and/or formed after metallization, the passivation layer 22 helps protect the underlying semiconductor devices. In some suitable embodiments, the passivation layer 22 is an oxide layer that may be deposited, for example, via chemical vapor deposition (CVD), plasma enhanced CVD (PECVD), or any other suitable deposition method.

In some suitable embodiments, the passivation layer 22 will have a relatively large thickness, for example, generally greater than or equal to about 15 kÅ (1.5 microns). In some suitable embodiments, the passivation layer 22 will have a thickness of about 32 kÅ or 3.2 µm. In accordance with some suitable embodiments, the passivation layer 22 is made to stop short of the outer periphery or edge 12 of the semiconductor wafer W by a distance D1, which may be, for example, about 1.0 mm or more.

As shown in FIG. 2, in accordance with some embodiments disclosed herein, a polyimide or other spin-on protective layer 24 is deposited and/or otherwise formed over the passivation layer 22. Suitably, the polyimide layer 24 is formed on the semiconductor wafer W, for example, by spin coating or another like suitable method. In some suitable embodiments, the polyimide layer 24 will have a thickness, for example, of generally about 5.0 µm.

Figure 3:
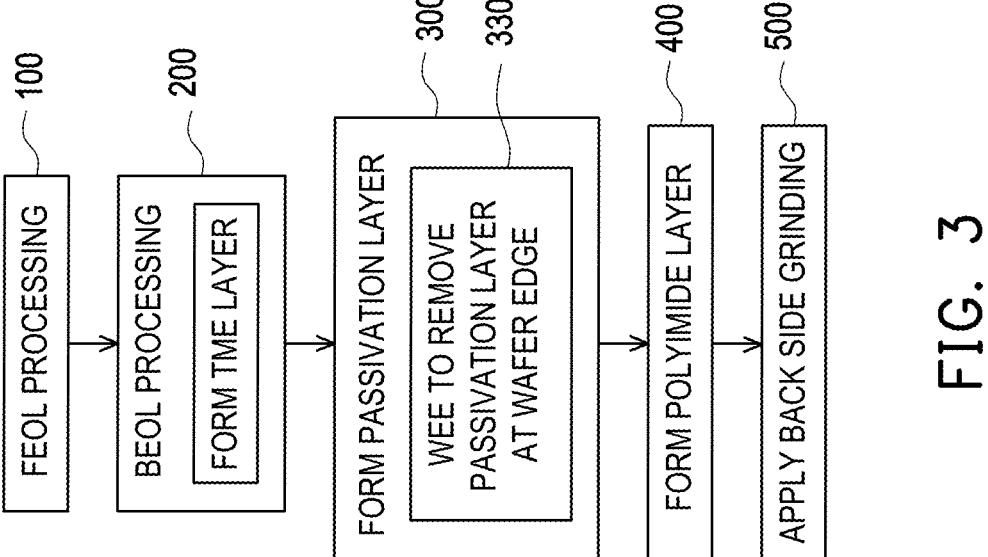
FIG. 3 is a flow chart showing a semiconductor fabrication method and/or process, in accordance with some embodiments disclosed herein.

In accordance with some suitable embodiments disclosed herein, FIG. 3 shows a flow chart illustrating a method and/or process 1000 for manufacturing the semiconductor structure shown in FIGS. 1 and 2.

As shown, the method or process 1000 begins with step 100, in which the FEOL portion of the semiconductor fabrication process is conducted. Suitably, in the FEOL processing step 100, a plurality of individual semiconductor devices and/or ICs are gradually formed on the semiconductor wafer W, for example, in the die or device regions 10. In some embodiments, the FEOL processes include, without limitation, selecting the type of semiconductor wafer to be used, chemical-mechanical planarization and cleaning of the wafer, shallow trench isolation (STI), well formation, gate module formation, and source and drain creation, among others.

After the FEOL processing step 100, a BEOL processing step 200 is conducted. In some embodiments, the BEOL portion is where, without limitation, individual devices (for example, transistors, capacitors, resistors, etc.) are interconnected with vias and conductive traces, for example. In general, there may be a number of metallization layers, sometimes denoted as metal layers M0, M1, M2, . . . , TME, where TME denotes the top metal layer, and with intervening intermetal dielectric (IMD) material and connecting vias formed between the devices and the various metal layers. As shown, the BEOL processing step 200 suitably includes the sub-step 210 of depositing, patterning and/or otherwise forming the TME layer 20. Suitably, the TME layer 20 may be deposited by, for example, by PVD, sputtering deposition, or any other suitable deposition method.

As shown in FIG. 3, the passivation layer 22 is deposited, patterned and/or otherwise formed in step 300. In accordance with some embodiments disclosed herein, step 300 suitably comprises a series of sub-steps as described more fully with respect to FIG. 4. Notably, the step 300 includes performing wafer edge exposure (WEE) 330 to remove an outermost annular ring of the passivation layer at the periphery of the semiconductor wafer W. As discussed further later herein, this provides protection against ingress of dust or other contaminants via the scribe lines 14 during the subsequent backside wafer thinning process.

Figure 4:
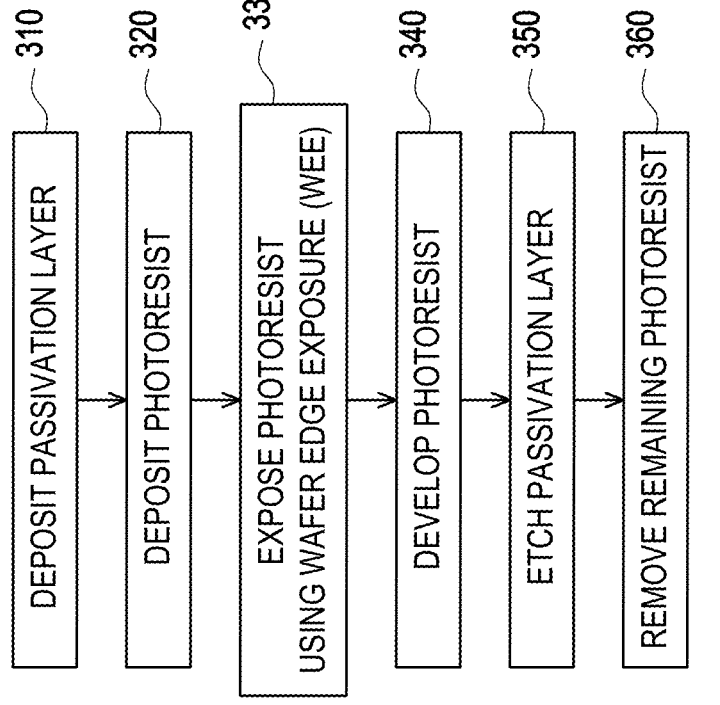
FIG. 4 is a flow chart showing in more detail a passivation layer formation step, in accordance with some embodiments disclosed herein, of the semiconductor fabrication method and/or process shown in FIG. 3.

In accordance with some suitable embodiments described herein, FIG. 4 shows an exemplary method, process and/or step 300 for depositing, patterning and/or otherwise forming the passivation layer 22.

Suitably, as shown in FIG. 4, the method, process or step 300 begins with a sub-step 310 of depositing the material (for example, oxide material or other suitable material from which the passivation layer 22 is formed) on the semiconductor wafer W over the TME layer 20. In some embodiments, the passivation layer 22 may be deposited, for example, via CVD, PECVD, or any other suitable deposition method. In practice, at this point, the deposited passivation layer 22 may extend to or substantially to the periphery or edge 12 of the semiconductor wafer W. For example, FIG. 5A illustrates an example of the configuration of the semiconductor wafer W following sub-step 310 and prior to sub-step 320.

Figures 5A, 5B, 5C, 5D, 5E:
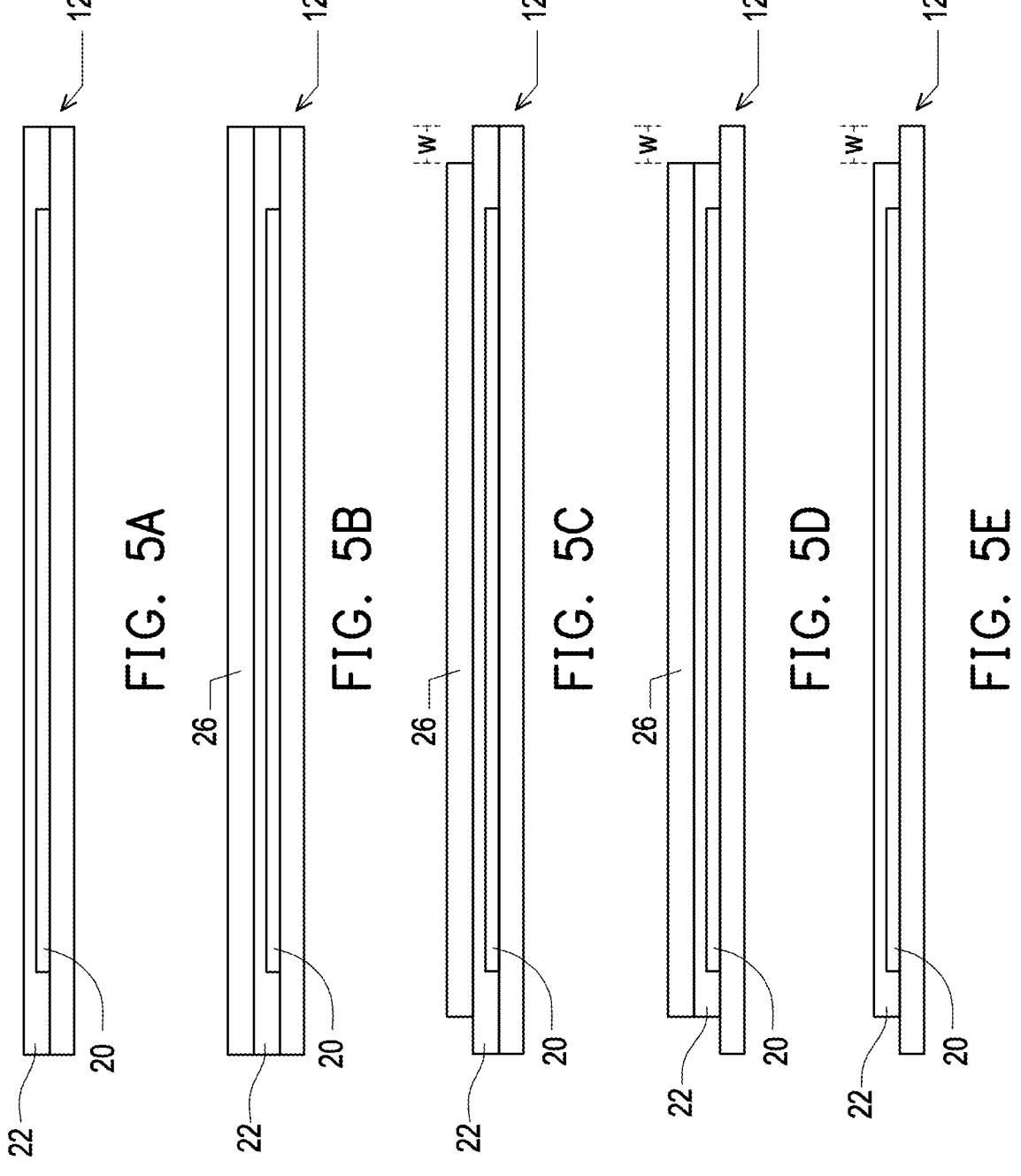
FIGS. 5A through 5E diagrammatically illustrate cross-section views of a semiconductor wafer, in accordance with some embodiments described herein, at various stages of a fabrication process.

Following sub-step 310, a layer 26 of photoresist material is deposited over the passivation layer 22 (see also FIG. 5B). In some embodiments, the photoresist layer 26 is a formed from a positive photoresist material. Accordingly, the photoresist material is light or radiation sensitive, so that when exposed to such light or radiation, the photoresist material becomes selectively soluble or dissolvable or otherwise removable by subsequent application of a suitable developer, while the unexposed photoresist material remains largely immune to the developer (i.e., so as to not be substantially or otherwise removed by the developer). In some embodiments, the photoresist layer 26 is applied by spin coating or another suitable deposition technique. For example, FIG. 5B illustrates an example of the configuration of the semiconductor wafer W following sub-step 320 and prior to sub-step 330. As shown in FIG. 5B, at this point, the photoresist layer 26 may extend to or substantially to the periphery or edge 12 of the semiconductor wafer W.

Following sub-step 320, in accordance with some embodiments disclosed herein, wafer edge exposure (WEE) is applied at sub-step 330.

Figure 6:
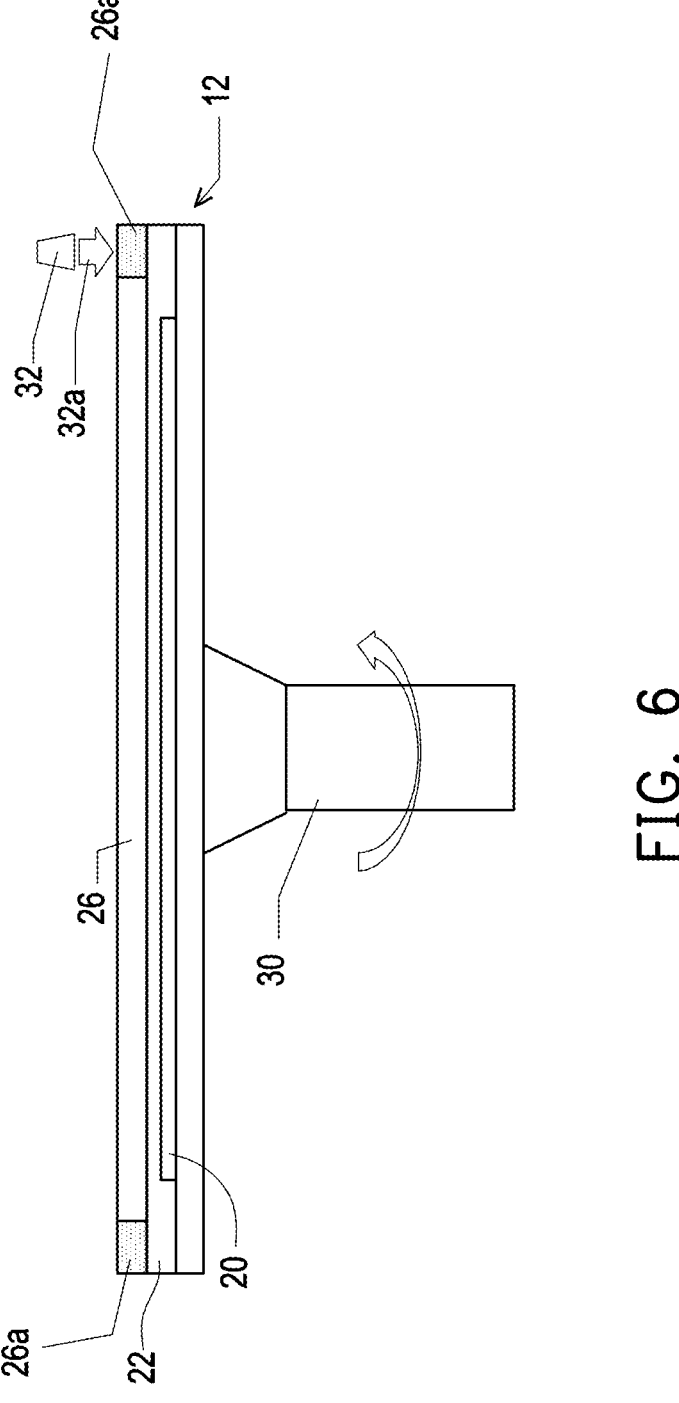
FIG. 6 is a diagrammatic illustration showing a wafer edge exposure technique used in accordance with some embodiments described herein.

With additional reference to FIG. 6, the WEE step 330 exposes an outer annular ring 26a of the photoresist layer 26, which is proximate the periphery or edge 12 of the semiconductor wafer W, to a beam of light or radiation 32a (for example, ultraviolet (UV) light or radiation) emitted from a light or radiation source 32. In accordance with some suitable embodiments disclosed herein, the light or radiation source 32 may be a laser or an optically focused illumination source or other like illumination source that outputs a light or radiation beam 32a producing a desired spot size on the photoresist layer 26. In practice, the spot size corresponds to a width of the outer annular ring 26a desired to be removed from the photoresist layer 26. In some suitable embodiments, the effective spot size may have a diameter, for example, of about 1.0 mm or more. Rather than or in addition to using a focused light source 32, a suitable light shield (not shown, e.g. a metal plate) can be provided to block stray light and thus ensure the light 32a illuminates only over the width corresponding to the outer annular ring 26a.

Suitably, the photoresist material of layer 26 is sensitive to the received light/radiation beam 32a, so that when exposed to such light or radiation, the photoresist material becomes selectively soluble or dissolvable or otherwise removable by subsequent application of a suitable developer, while the unexposed photoresist material remains largely immune to the developer.

The WEE exposure sub-step 330 is suitably performed, in some embodiments, employing a WEE technique as shown in FIG. 6. In particular, the photoresist coated semiconductor wafer W is suitably positioned on and/or secured to a rotatable chuck 30, for example, a vacuum chuck or an electrostatic chuck or the like. In some embodiments, the light/radiation source 32 is positioned over the photoresist layer 26 at or near the periphery or edge 12 of the semiconductor wafer W. While the source 32 emits the beam 32a toward and/or onto the photoresist layer 26, the chuck 30 rotates the semiconductor wafer W. Accordingly, the outer annular ring 26a of the photoresist layer 26, which is proximate the periphery or edge 12 of the semiconductor wafer W, is exposed to the beam of light or radiation 32a emitted from the light/radiation source 32 as the chuck 30 and/or secured semiconductor wafer W rotate thereunder.

In some suitable embodiments, the annular ring 26a of the exposed photoresist layer 26 has a width w (measured along a radial direction with respect to the semiconductor wafer W) of, for example, about 1.0 mm or more.

In some suitable alternate embodiments, the exposure sub-step 330 may be performed via any suitable photolithography technique. For example, a stepper or scanner or other suitable projection and/or illumination source may be employed along with a suitable photomask to form a patterned exposure of light or radiation on the photoresist layer 26, where the outer annular ring 26a is exposed, while the remaining central portion of the photoresist layer 26 remains unexposed. In still some other alternate embodiments, the photoresist layer 26 may comprise a negative photoresist material, and accordingly, the patterned illumination may be such that the central portion of the photoresist layer 26 receives exposure, while outer annular ring 26a of the photoresist layer remains unexposed.

Returning attention now to FIG. 4, in accordance with some suitable embodiments disclosed herein, a development sub-step 340 follows the exposure sub-step 330. Suitably, during the development sub-step 340 a developer is applied to the photoresist layer 26 to selectively remove a portion thereof. In particular, the developer acts to dissolve or otherwise remove the annular ring portion 26a of the photoresist layer 26 proximate the periphery or edge 12 of the semiconductor wafer W, while the central portion of the photoresist layer 26 remains wholly or largely unremoved by the applied developer. Accordingly, at this point, as shown in FIG. 5C, the photoresist layer 26 no longer extends to the periphery or edge 12 of the semiconductor wafer W. Rather, the photoresist layer 26 falls short of the periphery or edge 12 of the semiconductor wafer W by a radial distance of w, for example, about 1.0 mm or more. FIG. 5C illustrates an example of the configuration of the semiconductor wafer W following sub-step 340 and prior to sub-step 350.

In accordance with some suitable embodiment disclosed herein, the development sub-step 340 is followed by an etching sub-step 350. As can be appreciated from viewing FIG. 5C, following the development sub-step 340, an annular ring portion of the passivation layer 22 previously underlying the removed annular ring portion 26a of the photoresist layer 26 is now exposed and/or uncover by the photoresist layer 26. Accordingly, during the etching sub-step 350, this uncovered annular ring portion of the passivation layer 22 is removed, while the remainder of the passivation layer 22 that is still covered and/or protected by the unremoved photoresist layer 26 remains substantially intact. In practice, any suitable etching or other like material removal process may be employed in the sub-step 350, for example, a liquid (i.e., wet) or plasma (i.e., dry) etching process may be employed. In some suitable embodiments, the etching process is an anisotropic etch which can tend to avoid significant undercutting of the photoresist. FIG. 5D illustrates an example of the configuration of the semiconductor wafer W following sub-step 350 and prior to sub-step 360.

As can be appreciated from FIG. 5D, at this point, the passivation layer 22 no longer extends to the periphery or edge 12 of the semiconductor wafer W. Rather, consistent with the removed annular ring 26a of the photoresist layer 26, after the etching sub-step 350, the passivation layer 22 also falls short of the periphery or edge 12 of the semiconductor wafer W by a radial distance of w, for example, about 1.0 mm or more.

Returning attention again to FIG. 4, in accordance with some suitable embodiment disclosed herein, the etching sub-step 350 may be followed by a further sub-step 360. In sub-step 360, the remaining photoresist layer 26 is suitably removed (i.e. stripped) as it is no longer required. In some embodiments, the remaining photoresist layer 26 may be removed using a liquid or other suitable photoresist stripper which chemically or otherwise alters the photoresist material so that it no loner adheres to the underlying material. In some embodiments, the remaining photoresist layer 26 may be removed using a process is referred to as ashing, where a plasma, for example, containing oxygen, is applied to the photoresist layer 26 thereby oxidizing it. In still some other embodiments, a suitable solvent may be used to dissolve the remaining portion of the photoresist layer 26. In any event, FIG. 5E illustrates an example of the configuration of the semiconductor wafer W following the removal of the remaining photoresist layer 26, that is, following sub-step 360.

Figure 7:
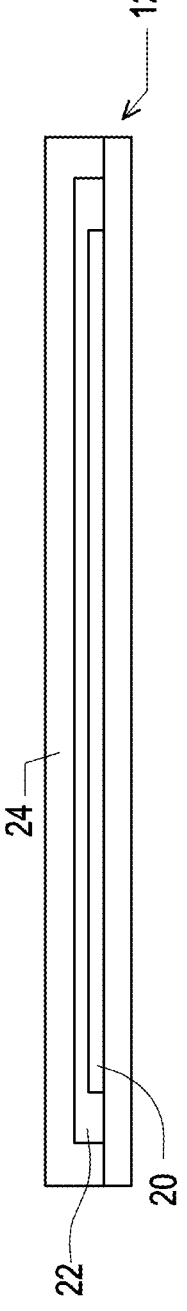
FIG. 7 diagrammatically illustrates a cross-section view of a semiconductor wafer in accordance with some embodiments disclosed herein.

Returning attention now to FIG. 3, having deposited, patterned and/or otherwise formed the passivation layer 22, for example, so that the passivation layer 22 no longer extends all the way to or substantially all the way to the periphery or edge 12 of the semiconductor wafer W, the polyimide layer 24, in some suitable embodiments disclosed herein, may be deposited and/or otherwise formed over the passivation layer 22. For example, as shown in FIG. 3, depositing and/or forming the polyimide layer 24 is step 400 in the method or process 1000. FIG. 7 shows a cross-section view of the semiconductor wafer W following deposition of the polyimide layer 24 in accordance with some suitable embodiments disclosed herein.

In some suitable embodiments, following formation of the passivation layer 22 (and/or prior to dicing processes), a physical failure analysis (PFA) may be performed, for example, at least at or near the semiconductor wafer's edge or periphery 12. Suitably, such PFA permits or aids in a detection of the existence of the passivation layer 22 at or near the wafer's edge or periphery 12. For example, the PFA may include optical microscopy, scanning electron microscopy (SEM) or the like conducted at or near the edge or periphery 12 in order to confirm and/or otherwise determine that the same is free of the passivation layer 22 (that is to say, as desired the passivation layer 22 does not extend all the way or substantially all the way to the edge or periphery 12 of the semiconductor wafer W), or alternately, that some amount of the passivation layer 22 has not been adequately removed from or otherwise remains at or near the edge or periphery 12 of the semiconductor wafer W (for example, that some undesired residual thickness of the passivation layer remains at or near the edge or periphery 12 of the semiconductor wafer W).

In accordance with some suitable embodiments disclosed herein, the polyimide layer 24 may be deposited and/or formed by a spin coating process to produce a uniform film. In practice, the spin coating process generally entails a relatively small amount of the polyimide coating material being applied at or near the center of the semiconductor wafer W, which is then spun or rotated (for example, by a rotating chuck to which the semiconductor wafer W is secured) to spread the coating material out toward the periphery or edge 12 of the semiconductor wafer W by centrifugal force. For example, as the polyimide material forming the polyimide layer 24 is spread and approaches the periphery or edge 12 of the semiconductor wafer W, it tends to build-up around the periphery or edge 12, for example, filling-in the annular space left by the etched away passivation layer 22, as shown in FIG. 2. Notably, this build-up of polyimide material near the periphery or edge 12 tends to produce a top surface 24a of the polyimide layer 24 which is relatively smooth, even and/or uniform.

As shown in FIG. 3, in accordance with some suitable embodiments disclosed herein, the method or process 1000 includes a back side grinding step 500 that is performed after the polyimide layer 24 is deposited and/or otherwise formed in step 400.

In accordance with some embodiments, the back side grinding step 500 includes first applying a protective tape to the device side of the semiconductor wafer W. In practice, the protective tape is applied to and/or covers the top surface 24a of the polyimide layer 24. With the protective tape applied, the semiconductor wafer W is positioned and secured on the device side, for example, by a vacuum or electrostatic chuck or other suitable holding device. With the semiconductor wafer W so held, mechanical grinding is then applied to the back side of the semiconductor wafer W, for example, to thin the semiconductor wafer W substrate to the desired thickness.

Generally, in practice, the mechanical grinding is conducted with a copious amount of water being supplied or introduced while an abrasive or other suitable grinding tool rubs against the back side surface of the semiconductor wafer W. The applied grinding removes material from the back side surface of the semiconductor wafer W. In the process, small dust particles and/or fragments (for example, removed from the back side surface of the semiconductor wafer W during the grinding process) are created.

Notably, where the passivation layer 22 permitted to extend all the way or substantially all the way to the periphery or edge 12 of the semiconductor wafer W, there would tend to be a trough or other like depression (at or near the periphery or edge 12 of the semiconductor wafer W) remaining in the top surface 24a of the polyimide layer 24 when the polyimide material was spun coated over the passivation layer 22. For example, such a trough or depression would generally tend to overlie or correspond to the location of the scribe lines 14 and extend from the outer periphery or edge 12 of the semiconductor wafer W toward an interior or central area of the semiconductor wafer W, for example, along a path of the scribe lines 14. Significantly, the protective tape, in this case, may not adequately seal the top surface 24a of the polyimide layer 24. That is to say, the protective tape may not sufficiently reach into and/or block the trough or depression which can tend to be substantially narrow. Accordingly, in this case, the trough or depression remains an open avenue or passageway for small dust particles and/or fragments generated during the back side grind step to flow and/or otherwise migrate (for example, carried by the water used in the grinding process or otherwise) from the outer periphery or edge 12 of the semiconductor wafer W into an interior or central area of the semiconductor wafer W, where the small dust particles and/or fragments can potentially cause defects.

However, as disclosed in the present specification, the passivation layer 22 is not permitted, in accordance with some embodiments, to extend all the way or substantially all the way to the periphery or edge 12 of the semiconductor wafer W. Rather, the passivation layer 22 stops short of the outer periphery or edge 12 of the semiconductor wafer W, for example, by an amount of about 1.0 mm or more. In some suitable embodiments, when the passivation layer 22 is initially deposited it may indeed extend all the way or substantially all the way to the outer periphery or edge 12 of the semiconductor wafer W, but subsequent to the initial deposition of the passivation layer 22, an outer annular ring portion of the passivation layer 22 (for example, having a width of about 1.0 mm or more measured along a radial direction with respect to the semiconductor wafer W) proximate to the periphery or edge 12 of the semiconductor wafer W is etched away or otherwise removed. For example, in accordance with some suitable embodiments, the outer annular ring of the passivation layer 22 may be removed by employing a WEE process during step 300, and in particular, during the etching sub-step 350.

In accordance with some suitable alternative embodiments, the passivation layer 22 may initially be formed and/or patterned so as not to extend all the way or substantially all the way to the periphery or edge 12 of the semiconductor wafer W. For example, a suitable mask and/or suitable photolithography techniques and/or other suitable methods may be employed so that when initially deposited, the passivation layer 22 stop short of extending all the way or substantially all the way to the periphery or edge 12 of the semiconductor wafer W.

Figure 8:
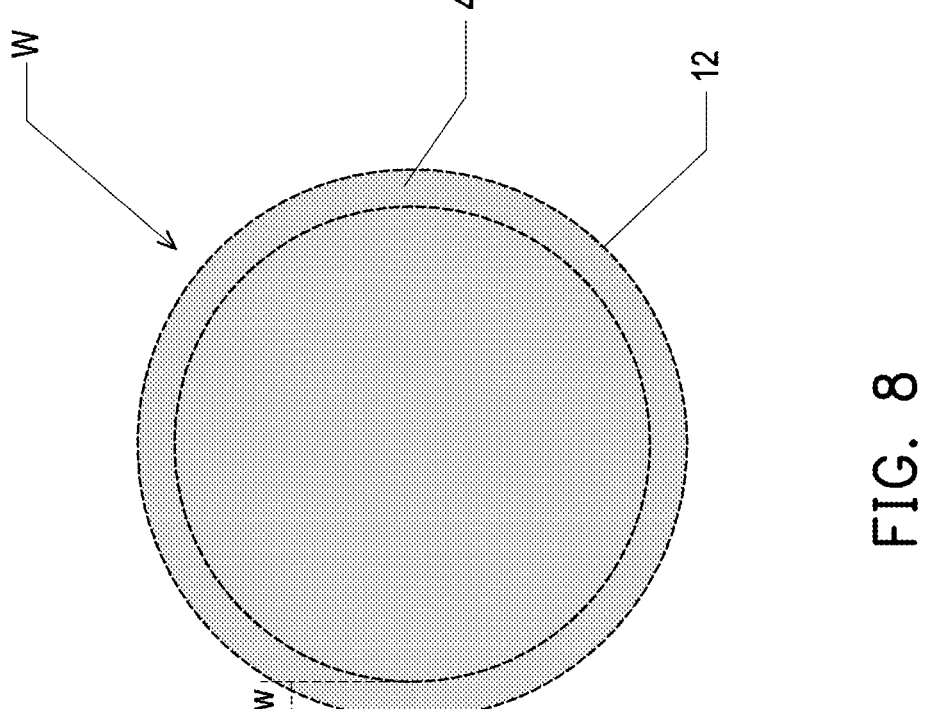
FIG. 8 is a further diagrammatic illustration showing a top plan view of a semiconductor wafer in accordance with some embodiments disclosed herein

In any event, with reference to FIG. 8, it is to be appreciated that an annular outer region 40 of the semiconductor wafer W remains free from the passivation layer 22. In some suitable embodiments, this annular outer region 40 has a width w of, for example, 1.0 mm or more, measured along a radial direction with respect to the semiconductor wafer W. In some suitable embodiments, the semiconductor wafer has a diameter of, for example, 99 mm or more. Accordingly, the passivation-layer-free annular outer region 40 has a relatively small surface area compared to the surface area of the whole semiconductor wafer W.

One advantage of having the passivation-layer-free outer annular region 40 is that when the polyimide layer 24 is spun coated over the passivation layer 22, it tends to collect and/or build-up in the space left free of the passivation layer 22 in such a way that the top surface 24 of the polyimide layer 24 remains substantially smooth, even and/or uniform at least at or near the periphery or edge 12 of the semiconductor wafer W (see, for example, FIG. 2). That is to say, the aforementioned troughs and/or depression (for example, which can tend to form in the top surface 24a of the polyimide layer 24 over the scribe lines 14 when the passivation layer 22 is allowed to extend all the way or substantially all the way to the periphery or edge 12 of the semiconductor wafer W) are eliminated and/or substantially reduced, for example, in depth and/or otherwise. Accordingly, when the protective tape is applied to the top surface 24a of the polyimide layer 24 to perform the back side grinding, the protective tape makes good, consistent contact with the top surface 24a of the polyimide layer 24 all around and at or near the periphery or edge 12 of the semiconductor wafer W, so that the flow and/or migration of the small dust particles and/or fragments generated during back side grinding toward an interior or central region of the semiconductor wafer W can be blocked or inhibited, hence limiting potential defects which could otherwise be caused thereby.

In the following, some further illustrative embodiments are described.

In some embodiments, a method is provided for fabricating a semiconductor wafer having a device side, a back side opposite the device side and an outer periphery edge. Suitably, the method includes: forming a top conducting layer on the device side of the semiconductor wafer; forming a passivation layer over the top conducting layer, the passivation layer being formed so as not to extend to the outer periphery edge of the semiconductor wafer; and forming a protective layer over the passivation layer, the protective layer being spin coated over the passivation layer so as to have a smooth top surface at least in a region proximate to the outer periphery edge of the semiconductor wafer.

In some further embodiments, the passivation layer stops short of the outer periphery edge of the semiconductor wafer by a distance of 1.0 mm or more.

In still additional embodiments, the semiconductor wafer has a diameter of 99.0 mm or more.

In some embodiments, the method further includes: conducting front-end-of-line processing on the semiconductor wafer prior to forming the top conducting layer, the front-end-of-line processing including creating a plurality of individual semiconductor devices in a plurality of individual device regions on the device side of the semiconductor wafer, the plurality of individual device regions being separate by a plurality of scribe lines residing between the individual device regions.

In yet further embodiments, the method further includes: applying a protective tape to the top surface of the protective layer; and applying grinding to the back side of the semiconductor wafer, thereby thinning a substrate of the semiconductor wafer.

In some further embodiments, the applied grinding generates fragments removed from the substrate of the semiconductor wafer, and the protective tape makes sufficient contact with the smooth top surface of the protective layer to inhibit migration of the fragments from the outer periphery edge of the semiconductor wafer toward a central portion of the semiconductor wafer between the protective tape and the top surface of the protective layer.

In some embodiments, forming the passivation layer includes: depositing the passivation layer over the top conducting layer so that the passivation layer extends to the outer periphery edge of the semiconductor wafer; and removing an outer annular ring portion of the deposited passivation layer proximate the outer periphery edge of the semiconductor wafer such that a remainder portion of the passivation layer no longer extends to the outer periphery edge of the semiconductor wafer In yet further embodiments, removing the outer annular ring portion of the deposited passivation layer includes: depositing a photoresist layer over the deposited passivation layer; exposing an outer annular ring portion of the photoresist layer to radiation; developing the photoresist layer to remove the exposed outer annular ring portion of the photoresist layer thereby uncovering the outer annular ring portion of the passivation layer thereunder, while not removing a remainder portion of the photoresist layer covering the remainder portion of the passivation layer; and applying etching to remove the uncovered outer annular ring portion of the passivation layer, the remainder portion of the passivation layer being protected from the etching by the remainder portion of the photoresist layer covering the same.

In some embodiments, the exposing includes: positioning a radiation source proximate the outer annular ring portion of the photoresist layer; producing a beam of radiation from the radiation source, the beam being directed toward and impinging on the outer annular ring portion of the photoresist layer; and rotating the semiconductor wafer as the beam impinges on the outer annular ring portion of the photoresist layer.

In some further embodiments, forming the top conductive layer is performed during a back-end-of-line portion of a semiconductor fabrication process.

In still further embodiments, the top conductive layer does not extend to the outer periphery edge of the semiconductor wafer, but rather stops short thereof by a distance of 1.8 mm or more.

In yet additional embodiments, the protective layer is a polyimide layer.

In some further embodiments, a method for fabricating a semiconductor wafer is provided. The semiconductor wafer suitably has a first side, a second side opposite the first side and an outer periphery edge. The method includes: conducting front-end-of-line processing on the semiconductor wafer, the front-end-of-line processing including creating a plurality of individual semiconductor devices in a plurality of individual device regions on the first side of the semiconductor wafer, the plurality of individual device regions being separate by a plurality of scribe lines residing between the individual device regions; conducting back-end-of-line processing on the semiconductor wafer, the back-end-of-line processing including forming a top conducting layer on the first side of the semiconductor wafer; depositing a passivation layer over the top conducting layer, the passivation layer being configured so as not to extend to the outer periphery edge of the semiconductor wafer; and spin coating a protective layer over the passivation layer such that a material creating the protective layer collects in a space between where the passivation layer stops and the outer periphery edge of the semiconductor wafer so that the protective layer is formed with a smooth top surface at least in a region proximate to the outer periphery edge of the semiconductor wafer.

In some embodiments, the passivation layer stops short of the outer periphery edge of the semiconductor wafer by a distance of 1.0 mm or more.

In some further embodiments, the method further includes: applying a protective tape to the top surface of the protective layer; and applying grinding to the second side of the semiconductor wafer, thereby thinning a substrate of the semiconductor wafer; wherein the applied grinding generates fragments removed from the substrate of the semiconductor wafer, and the protective tape makes sufficient contact with the smooth top surface of the protective layer to inhibit migration of the fragments from the outer periphery edge of the semiconductor wafer toward a central portion of the semiconductor wafer between the protective tape and the top surface of the protective layer.

In some additional embodiments, the passivation layer is formed by: depositing the passivation layer over the top conducting layer so that the passivation layer extends to the outer periphery edge of the semiconductor wafer; and removing an outer annular ring portion of the deposited passivation layer proximate the outer periphery edge of the semiconductor wafer such that a remainder portion of the passivation layer no longer extends to the outer periphery edge of the semiconductor wafer In some embodiments, removing the outer annular ring portion of the deposited passivation layer includes: depositing a photoresist layer over the deposited passivation layer; irradiating the photoresist layer with a pattern of light; developing the photoresist layer to remove an outer annular ring portion of the photoresist layer thereby uncovering the outer annular ring portion of the passivation layer thereunder, while not removing a remainder portion of the photoresist layer covering the remainder portion of the passivation layer; and applying etching to remove the uncovered outer annular ring portion of the passivation layer, the remainder portion of the passivation layer being protected from the etching by the remainder portion of the photoresist layer covering the same.

In still further embodiments, the irradiating incudes: generating a beam of light with a light source, the beam being directed toward and impinging on the outer annular ring portion of the photoresist layer; and rotating the semiconductor wafer as the beam impinges on the outer annular ring portion of the photoresist layer.

In yet further embodiments, a semiconductor wafer is provided, having a first side, a second side opposite the first side and an outer periphery edge. The semiconductor wafer includes: a plurality of individual semiconductor devices formed in a plurality of individual device regions on the first side of the semiconductor wafer, the plurality of individual device regions being separate by a plurality of scribe lines residing between the individual device regions; a top conducting layer on the first side of the semiconductor wafer; a passivation layer over the top conducting layer, the passivation layer not extending to the outer periphery edge of the semiconductor wafer; and a polyimide layer spun-on coated over the passivation layer such that a material creating the polyimide layer collects in a space between where the passivation layer stops and the outer periphery edge of the semiconductor wafer so that the polyimide layer is formed with a smooth top surface at least in a region proximate to the outer periphery edge of the semiconductor wafer.

In still one more embodiment, the passivation layer stops short of the outer periphery edge of the semiconductor wafer by a distance of 1.0 mm or more.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor wafer having a device side, a back side opposite the device side and an outer periphery edge, said method comprising:

forming a plurality of patterned metallization layers with intervening intermetal dielectric layers on the device side of the semiconductor wafer, the plurality of patterned metallization layers including a top patterned metallization layer of the plurality of patterned metallization layers;

forming a passivation layer directly contacting and covering a top surface and sides of the top patterned metallization layer, the passivation layer being formed so as not to extend to the outer periphery edge of the semiconductor wafer; and forming a protective layer directly contacting and covering a top surface and sides of the passivation layer, the protective layer extending to the outer periphery edge of the semiconductor wafer and being spin coated over the passivation layer so as to have a smooth top surface at least in a region proximate to the outer periphery edge of the semiconductor wafer.

2. The method of claim 1, wherein the passivation layer stops short of the outer periphery edge of the semiconductor wafer by a distance of 1.0 mm or more.

3. The method of claim 2, wherein the semiconductor wafer has a diameter of 99.0 mm or more.

4. The method of claim 1, further comprising:

conducting front-end-of-line processing on the semiconductor wafer prior to forming the top patterned metallization layer, said front-end-of-line processing including creating a plurality of individual semiconductor devices in a plurality of individual device regions on the device side of the semiconductor wafer, the plurality of individual device regions being separated by a plurality of scribe lines residing between the individual device regions;

wherein the protective layer spin coated over the passivation layer collects in a space produced by the passivation layer not extending to the outer periphery edge of the semiconductor wafer to produce the smooth top surface at least in the region proximate to the outer periphery edge of the semiconductor wafer.

5. The method of claim 1, further comprising:

applying a protective tape to the top surface of the protective layer; and applying grinding to the back side of the semiconductor wafer, thereby thinning a substrate of the semiconductor wafer.

6. The method of claim 5, wherein:

the protective layer spin coated over the passivation layer collects in an annular space produced by the passivation layer not extending to the outer periphery edge of the semiconductor wafer to produce the smooth top surface at least in the region proximate to the outer periphery edge of the semiconductor wafer;

the applied grinding generates fragments removed from the substrate of the semiconductor wafer; and the method further includes blocking the fragments from the outer periphery edge of the semiconductor wafer generated by the grinding from migrating into a central portion of the semiconductor wafer, the blocking being provided by a seal between the protective tape and the smooth top surface of the protective layer.

7. The method of claim 1, wherein forming the passivation layer comprises:

depositing the passivation layer over the top patterned metallization layer so that the passivation layer extends to the outer periphery edge of the semiconductor wafer; and removing an outer annular ring portion of the deposited passivation layer proximate the outer periphery edge of the semiconductor wafer such that a remainder portion of the passivation layer no longer extends to the outer periphery edge of the semiconductor wafer.

8. The method of claim 7, wherein removing the outer annular ring portion of the deposited passivation layer comprises:

depositing a photoresist layer over the deposited passivation layer;

exposing an outer annular ring portion of the photoresist layer to radiation;

developing the photoresist layer to remove the exposed outer annular ring portion of the photoresist layer thereby uncovering the outer annular ring portion of the passivation layer thereunder, while not removing a remainder portion of the photoresist layer covering the remainder portion of the passivation layer; and applying etching to remove the uncovered outer annular ring portion of the passivation layer, said remainder portion of the passivation layer being protected from said etching by the remainder portion of the photoresist layer covering the same.

9. The method of claim 8, wherein said exposing comprises:

positioning a radiation source proximate the outer annular ring portion of the photoresist layer;

producing a beam of radiation from the radiation source, said beam being directed toward and impinging on the outer annular ring portion of the photoresist layer; and rotating the semiconductor wafer as the beam impinges on the outer annular ring portion of the photoresist layer.

10. The method of claim 1, wherein forming the top conductive layer is performed during a back-end-of-line portion of a semiconductor fabrication process.

11. The method of claim 10, wherein the top patterned metallization layer does not extend to the outer periphery edge of the semiconductor wafer, but rather stops short thereof by a distance of 1.8 mm or more.

12. The method of claim 1, wherein the passivation layer is an oxide layer and the protective layer is a polyimide layer.

13. A method for fabricating a semiconductor wafer having a first side, a second side opposite the first side and an outer periphery edge, said method comprising:

conducting front-end-of-line processing on the semiconductor wafer, said front-end-of-line processing including creating a plurality of individual semiconductor devices in a plurality of individual device regions on the first side of the semiconductor wafer, the plurality of individual device regions being separated by a plurality of scribe lines residing between the individual device regions;

conducting back-end-of-line processing on the semiconductor wafer, said back-end-of-line processing including forming a plurality of patterned metallization layers with intervening intermetal dielectric layers and terminating in a top patterned metallization layer of the plurality of patterned metallization layers formed on the device regions on the first side of the semiconductor wafer;

depositing a passivation layer that directly contacts and covers a top surface and sides of the top patterned metallization layer, the passivation layer being configured so as not to extend to the outer periphery edge of the semiconductor wafer;

spin coating a protective layer that directly contacts and covers a top surface and sides of the passivation layer such that a material creating the protective layer collects in a space between where the passivation layer stops and the outer periphery edge of the semiconductor wafer so that the protective layer is formed with a smooth top surface at least in a region proximate to the outer periphery edge of the semiconductor wafer, and an outer periphery edge of the protective layer coincides with the outer periphery edge of the semiconductor wafer.

14. The method of claim 13, wherein the passivation layer stops short of the outer periphery edge of the semiconductor wafer by a distance of 1.0 mm or more.

15. The method of claim 13, further comprising:

applying a protective tape to the top surface of the protective layer;

applying grinding to the second side of the semiconductor wafer, thereby thinning a substrate of the semiconductor wafer; and, during the grinding, blocking fragments removed from the substrate of the semiconductor wafer by the grinding from migrating from the outer periphery edge of the semiconductor wafer toward a central portion of the semiconductor wafer using a seal between the protective tape and the smooth top surface of the protective layer.

16. The method of claim 13, wherein the passivation layer is formed by:

depositing the passivation layer over the top patterned metallization layer so that the passivation layer extends to the outer periphery edge of the semiconductor wafer; and removing an outer annular ring portion of the deposited passivation layer proximate the outer periphery edge of the semiconductor wafer such that a remainder portion of the passivation layer no longer extends to the outer periphery edge of the semiconductor wafer.

17. The method of claim 16, wherein removing the outer annular ring portion of the deposited passivation layer comprises:

depositing a photoresist layer over the deposited passivation layer;

irradiating the photoresist layer with a pattern of light;

developing the photoresist layer to remove an outer annular ring portion of the photoresist layer thereby uncovering the outer annular ring portion of the passivation layer thereunder, while not removing a remainder portion of the photoresist layer covering the remainder portion of the passivation layer; and applying etching to remove the uncovered outer annular ring portion of the passivation layer, said remainder portion of the passivation layer being protected from said etching by the remainder portion of the photoresist layer covering the same.

18. The method of claim 17, wherein said irradiating comprises:

generating a beam of light with a light source, said beam being directed toward and impinging on the outer annular ring portion of the photoresist layer; and rotating the semiconductor wafer as the beam impinges on the outer annular ring portion of the photoresist layer.

19. A method of fabricating a semiconductor wafer having a device side and a back side opposite the device side, said method comprising:

forming a plurality of patterned metallization layers with intervening intermetal dielectric layers and terminating in a top patterned metallization layer on the device side of the semiconductor wafer;

depositing a passivation layer contacting and covering a top surface and sides of the top patterned metallization layer, the passivation layer extending to an outer edge of the semiconductor wafer;

depositing a photoresist layer over the passivation layer;

exposing the photoresist layer to radiation and developing the photoresist layer to remove an annular ring portion of the photoresist layer;

performing etching to remove an outer annular ring portion of the passivation layer uncovered by the removal of the annular ring portion of the photoresist layer;

spin coating a protective layer that directly contacts and covers a top surface and sides of the passivation layer and an outer annular ring portion of the device side of the semiconductor wafer that is exposed by the removal of the outer annular ring portion of the passivation layer, wherein the protective layer extends to the outer edge of the semiconductor wafer and is an outermost layer on the device side of the semiconductor wafer;

applying a protective tape to a top surface of the protective layer;

after applying the protective tape, grinding the back side of the semiconductor wafer; and blocking fragments generated by the grinding from migrating into a central portion of the semiconductor wafer, the blocking being provided by a seal between the protective tape and the top surface of the protective layer.

20. The method of claim 19, wherein the exposing of the photoresist layer to radiation includes one of:

(i) applying a beam of the radiation to a portion of the outer annular ring portion of the photoresist layer and, during the applying, rotating the semiconductor wafer; or (ii) exposing the photoresist layer to the radiation using a photomask.

* * * * *